United States Patent [19]

Schneider

[11] Patent Number: 4,904,869
[45] Date of Patent: Feb. 27, 1990

[54] X-RAY SENSOR HAVING A HIGH MASS NUMBER CONVERTOR AND A SUPERCONDUCTING DETECTOR

[75] Inventor: Richard T. Schneider, Alachua, Fla.

[73] Assignee: Progress Technologies Corporation, St. Petersburg, Fla.

[21] Appl. No.: 284,378

[22] Filed: Dec. 14, 1988

[51] Int. Cl.$^4$ .................. H01L 39/00; G01T 1/00
[52] U.S. Cl. .................. 250/336.2; 505/848; 505/849
[58] Field of Search .............. 250/336.2, 394; 505/848, 849

[56] References Cited

U.S. PATENT DOCUMENTS

| | | | |
|---|---|---|---|
| 2,189,122 | 2/1949 | Andrews | 250/336.2 |
| 3,939,706 | 2/1976 | Pinson | 250/352 |
| 4,126,783 | 11/1978 | Lanza et al. | 250/336.2 |
| 4,135,091 | 1/1979 | Lanza et al. | 250/336.2 |
| 4,135,281 | 1/1979 | Murray | 250/394 |
| 4,149,075 | 4/1979 | Drukier et al. | 250/336.2 |
| 4,412,427 | 11/1983 | Horn et al. | 62/514 R |
| 4,420,688 | 12/1983 | Le Bars | 250/352 |
| 4,450,693 | 6/1984 | Green et al. | 250/352 |
| 4,474,036 | 10/1984 | Ball et al. | 250/352 |
| 4,565,925 | 1/1986 | Anderson et al. | 250/352 |
| 4,687,342 | 8/1987 | Betzler et al. | 250/352 |
| 4,765,749 | 8/1988 | Bourgade et al. | 250/352 |

Primary Examiner—Carolyn E. Fields
Attorney, Agent, or Firm—Cushman, Darby & Cushman

[57] ABSTRACT

The present invention provides an x-ray sensor that converts x-ray radiation into infrared radiation using a high mass number material. The infrared radiation that results from this conversion is then detected using a superconducting detector. The superconducting detector uses a superconducting material for each of a plurality of detector elements that are temperature biased at the superconducting-nonsuperconducting transition temperature. As infrared photons strike one of the detector elements, the temperature of the superconducting detector element increases, which causes an increase in the resistance of the detector element. Using the output of each detector element an image of the original x-ray radiation is obtained.

10 Claims, 1 Drawing Sheet

X-RAY SENSOR HAVING A HIGH MASS NUMBER CONVERTOR AND A SUPERCONDUCTING DETECTOR

BACKGROUND OF THE INVENTION

1. The Field of the Art

This invention is directed to an x-ray sensor, and, more specifically, to an x-ray sensor having a high mass number convertor and a superconducting detector.

2. Description of the Prior Art

X-ray radiation is used, for example, in diagnostic applications in which x-ray radiation is passed through a patient's body, and, due to the different absorption of photons in the body for various types of body tissue, bones, and other body materials, the photons exiting the body create a pattern that is detected and reproduced.

Known x-ray detectors typically operate by converting outgoing x-ray radiation into visible radiation and then detecting visible light using light detectors such as photomultiplier tubes, photocells, and photocells. The conversion of the x-ray radiation into visible radiation requires a scintillator that absorbs the x-ray radiation and converts it into visible light.

However, x-rays penetrate matter readily, including scintillating materials. Also, scintillating materials used for x-ray detection must be kept sufficiently thin to allow visible radiation to pass. Because the thickness of the scintillating material cannot be substantially increased, it becomes necessary to increase the amount of radiation to which a patient must be exposed. This increased exposure is dangerous to the patient.

Attempts to make an improved x-ray sensor have been set forth. One such example is U.S. Pat. No. 4,135,091 to Lanza, in which a superconducting material is used to directly detect photons of x-ray radiation. In the Lanza device the detector is made of superconducting material and operates using the Meissner effect. A plurality of layered coils in the superconducting material are necessary to detect a large percentage of the incident photons, which make this device is quite complicated and, in turn, difficult and expensive to manufacture.

Thus, a simply constructed device that can detect a large percentage of x-ray radiation is needed.

SUMMARY OF THE INVENTION

It is an object of the present invention to provide a device that can detect a large percentage of x-ray radiation.

It is another object of the present invention to provide a device that transforms x-ray radiation into infrared radiation and then detects this infrared radiation to obtain a visual image of the composition of the material being detected, which could be, for instance, a human body.

In order to attain the above recited objects of the invention, among others, the present invention provides an x-ray sensor that converts x-ray radiation into infrared radiation using a high mass number material. The infrared radiation that results from this conversion is then detected using a superconducting detector. The superconducting detector uses a superconducting material for each of a plurality of detector elements that are temperature biased at the superconducting-nonsuperconducting transition temperature. As infrared photons strike one of the detector elements, the temperature of the superconducting detector element increases, which causes an increase in the resistance of the detector element. Using the output of each detector element an image of the original x-ray radiation is obtained.

Because almost 100% of the x-ray radiation is transformed into infrared radiation, and almost 100% of the infrared radiation is detected, the efficiency of this detector device is very high.

BRIEF DESCRIPTION OF THE DRAWINGS

These and other advantages of the present invention may be appreciated from studying the following detailed description of the preferred embodiment together with the drawings in which.

DETAILED DESCRIPTION OF THE PREFERRED EMBODIMENT

Figure 1:
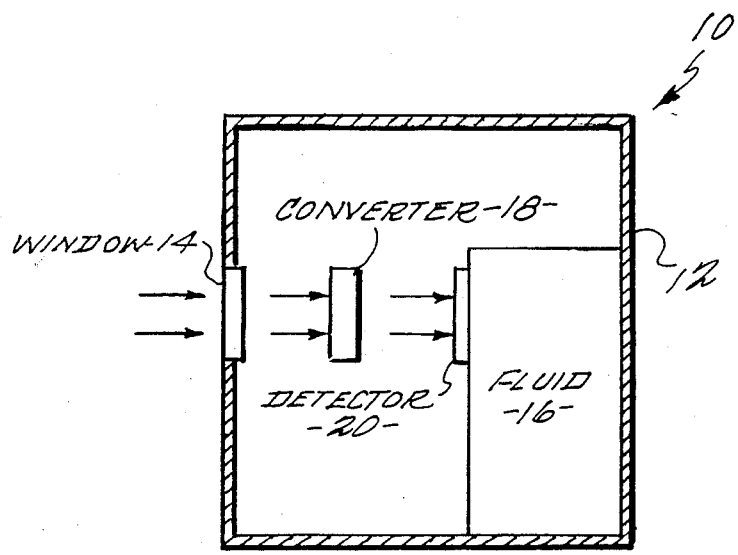
FIG. 1 illustrates an x-ray sensor according to the present invention.

FIG. 1 illustrates x-ray sensor 10. An outer housing 12 contains a window 14, which is affixed to outer housing 12 in such a way that a vacuum can be established in within the outer housing 12. Window 14 is made of material that is transparent to x-ray radiation.

Inside outer housing 12 is a cryostat 16, which is filled with liquid nitrogen and maintains the temperature of superconducting detector 20 at the transition temperature between the superconducting and non-superconducting state. The U.S. patent application Ser. No. 137,131 discloses how to keep a superconducting material such as superconducting detector 20 at the transition temperature and is incorporated by reference into this disclosure. The inside of outer housing 12 is kept in a vacuum to prevent window 14 from frosting due to the extreme cold caused by cryostat 16.

Behind window 14, and in the path of x-ray radiation that passes through window 14, is an convertor 18 that transforms the absorbed x-ray radiation into infrared radiation. So that the greatest percentage of x-rays that impinge on convertor 18 are actually converted into infrared radiation, convertor 18 is made of a material having a high mass number, such as uranium, lead, or other material. Because materials having a high mass number have a high absorption coefficient, the absorption of the incident x-ray radiation will increase. The absorbed x-ray radiation is converted into infrared radiation due to the resulting blackbody radiation. The emitted infrared radiation corresponds to the temperature assumed by convertor 18 as a result of the irradiation by the x-ray radiation.

If the convertor 18 is chosen so that all the incident x-ray radiation is absorbed, conversion efficiency near 100% can be achieved.

Behind convertor 18, superconducting detector 20 is mounted to cryostat 16. Mounting superconducting detector 20 to cryostat 16 makes it easier to maintain superconducting detector 20 at its transition temperature. Although the transition temperature will vary for different types and sizes of superconducting materials used, the transition temperature can be kept constant at the transition temperature as described in U.S. patent Ser. No. 137,161 so that any incident infrared radiation will cause an increase in temperature in superconducting detector 20.

Figure 2:
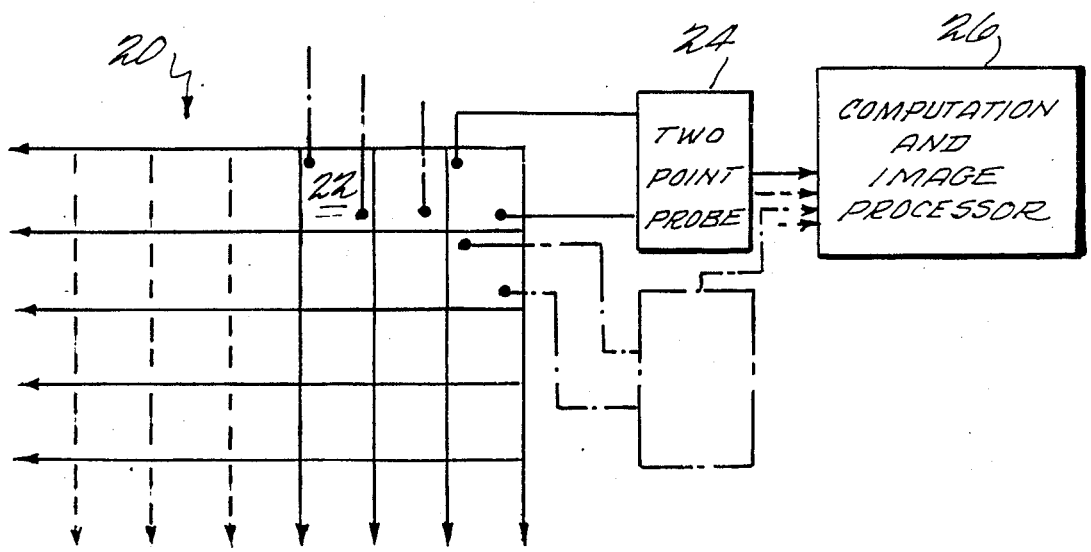
FIG. 2 illustrates a portion of the superconducting detector according to the present invention.

Superconducting detector 20 is further illustrated in FIG. 2 as an array of detector elements 22. Each detector element 22 is made up of grains of superconducting material. The individual grains of the superconducting material should be no larger than 1,000 Angstroms. A superconducting detector 20 that has individual grains less than 1,000 Angstroms can be obtained by pulverizing the superconducting material and then firing it in an oven for a period of time at a temperature greater than the temperature at which the superconducting detector 20 will reach when being used. Firing the superconducting detector 20 to a higher temperature, such as 1000° K., will ensure a superconducting detector 20 having a long working life. Once the superconducting material has been fired, it can be mounted on a substrate of sapphire or quartz, polished to 100–1000 Angstroms, and then cut into individual detector element 22, preferably having a size of 5 μm by 5 μm by etching or laser trimming. Examples of superconducting materials that can be used are listed in U.S. patent Ser. No. 07/137,161.

As illustrated in FIG. 2, each detector element 22 has two leads 22. The portion of the leads on the semiconductor substrate can be made of wires or superconducting material, preferably superconducting material. Each lead is connected to a current source and a potentiometer to form a two point probe 24. The change in resistance of the detector element 22 due to the incident infrared radiation can be sensed with two point probe 24 and the results for each detector elements 22 tabulated and processed by computation and image producing processor 26.

In operation, once superconducting detector 20 is brought to the transition temperature, x-ray radiation from, for example, a patient having an x-ray taken, passes through window 14 and is absorbed by convertor 18. Blackbody infrared radiation is emitted in proportion to the amount of x-ray radiation that strikes convertor 18. This infrared radiation then strikes the various detector elements 22 of superconducting detector 20. This causes some detector elements 22 to change from the superconducting state to the non-superconducting state, some detector elements 22 to change partially from the superconducting state to the non-superconducting state, and some of the detector elements 22 not to change state at all. The combination of all the sensed resistances of detector elements 22 allows an image of the pattern that corresponds to the x-rays from the body under consideration to be produced.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:
1. An apparatus for sensing x-ray radiation comprising:
   a housing:
   a window formed in said housing that is transparent to x-ray radiation;
   means disposed in said housing for converting x-ray radiation into infrared radiation;
   means disposed in said housing for detecting said infrared radiation, said detecting means including a superconducting material that has a varying resistance for a given temperature range between a superconducting and a non-superconducting state;
   means disposed in said housing for maintaining said detecting means within said given temperature range; and
   means for sensing said varying resistance of said detecting means.
2. An apparatus according to claim 1 wherein said detecting means comprises a plurality of detecting elements arranged in an array.
3. An apparatus according to claim 2 wherein each of said detecting elements has an area that is 5 μm by 5 μm.
4. An apparatus according to claim 1 wherein said converting means is a material having a high mass number.
5. An apparatus according to claim 4 wherein said material is uranium.
6. An apparatus according to claim 4 wherein said material is lead.
7. An apparatus according to claim 1 wherein said sensing means is a two point probe.
8. A method of sensing x-ray radiation comprising the steps of:
   biasing a superconducting detector that has a varying resistance for a given temperature range within that temperature range;
   illuminating a convertor material having a high mass number with x-ray radiation;
   converting said radiation into infrared radiation using said convertor material;
   directing said infrared radiation to strike said superconducting detector; and
   sensing said varying resistance of said superconducting detector.
9. A method according to claim 8 wherein said infrared radiation strikes a plurality of detector elements that make up said superconducting detector.
10. A method according to claim 8 wherein: said illuminating step causes heating of said converting material; and said converting step causes emission of blackbody infrared radiation.

* * * * *